United States Patent
Hara et al.

(10) Patent No.: US 9,089,045 B2
(45) Date of Patent: Jul. 21, 2015

(54) DISPLAY APPARATUS

(71) Applicant: FUJITSU LIMITED, Kawasaki-shi, Kanagawa (JP)

(72) Inventors: Noritaka Hara, Kamakura (JP); Hideyuki Fujikawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 185 days.

(21) Appl. No.: 13/676,824

(22) Filed: Nov. 14, 2012

(65) Prior Publication Data

US 2013/0250496 A1  Sep. 26, 2013

(30) Foreign Application Priority Data

Mar. 22, 2012  (JP) .................... 2012-066391

(51) Int. Cl.
 *H05K 5/00* (2006.01)
 *H04N 5/00* (2011.01)
 *G06F 1/16* (2006.01)
 *H04N 5/64* (2006.01)
(52) U.S. Cl.
 CPC ............ *H05K 5/0017* (2013.01); *G06F 1/16* (2013.01); *G06F 1/1601* (2013.01); *H04N 5/00* (2013.01); *H04N 5/64* (2013.01); *G06F 2200/1612* (2013.01); *H05K 5/0052* (2013.01); *H05K 5/0073* (2013.01)

(58) Field of Classification Search
 CPC ..... H05K 5/00; H05K 5/0017; H05K 5/0023; H05K 5/0073
 USPC ............... 361/679.21, 679.22, 679.29, 679.2
 See application file for complete search history.

(56) References Cited

U.S. PATENT DOCUMENTS

| | | | | |
|---|---|---|---|---|
| 5,101,568 A | * | 4/1992 | Ferragamo | .................... 33/3 B |
| 6,288,891 B1 | * | 9/2001 | Hasegawa et al. | ....... 361/679.07 |
| 7,120,011 B2 | * | 10/2006 | Takahashi et al. | ....... 361/679.21 |
| 7,889,484 B2 | * | 2/2011 | Choi | ........................ 361/679.21 |
| 2010/0182531 A1 | * | 7/2010 | Teratani | .......................... 349/58 |

FOREIGN PATENT DOCUMENTS

| | | |
|---|---|---|
| JP | 2009-237246 A | 10/2009 |
| JP | 2010-191407 A | 9/2010 |

* cited by examiner

*Primary Examiner* — Jayprakash N Gandhi
*Assistant Examiner* — Mandeep Buttar
(74) *Attorney, Agent, or Firm* — Maschoff Brennan

(57) ABSTRACT

A display apparatus includes: a display unit; a frame that covers a side surface of the display unit; and a pressing member including a facing portion that faces the side surface of the display unit, a pressing portion that protrudes from the facing portion and presses a rear surface of the display unit, and a fixing portion fixed to the frame.

12 Claims, 16 Drawing Sheets

FIG. 3A
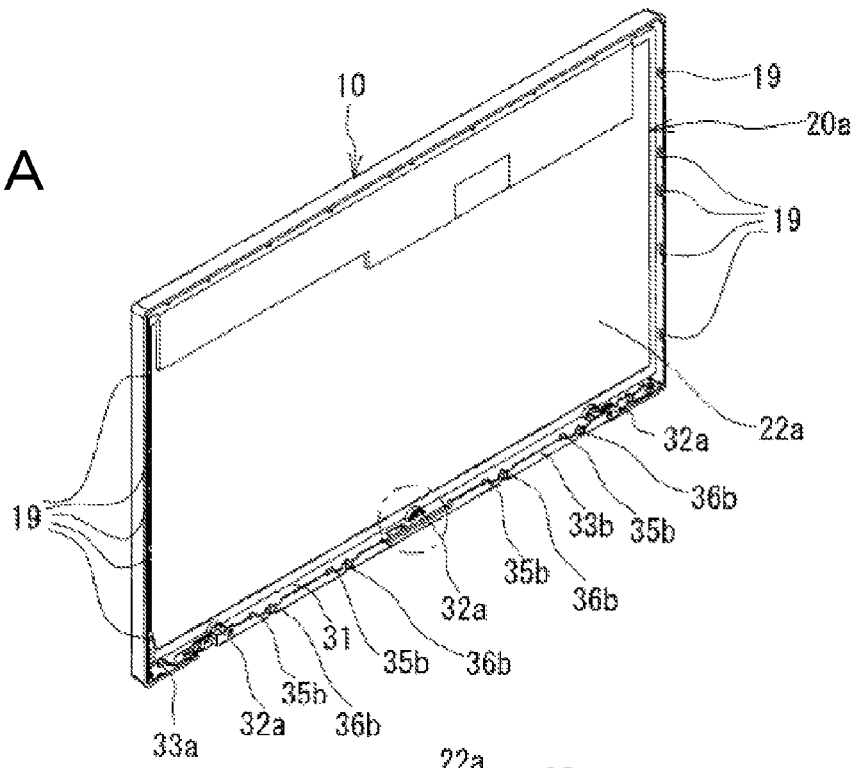
FIG. 3B
FIG. 3C
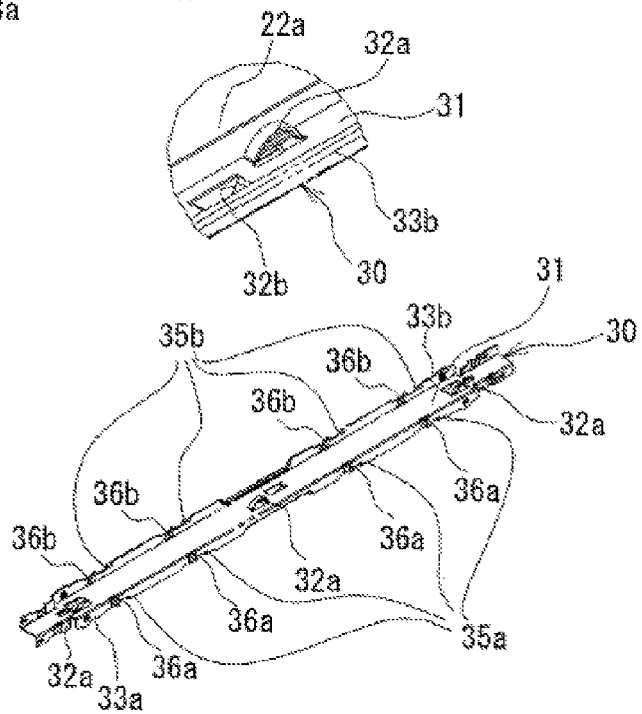

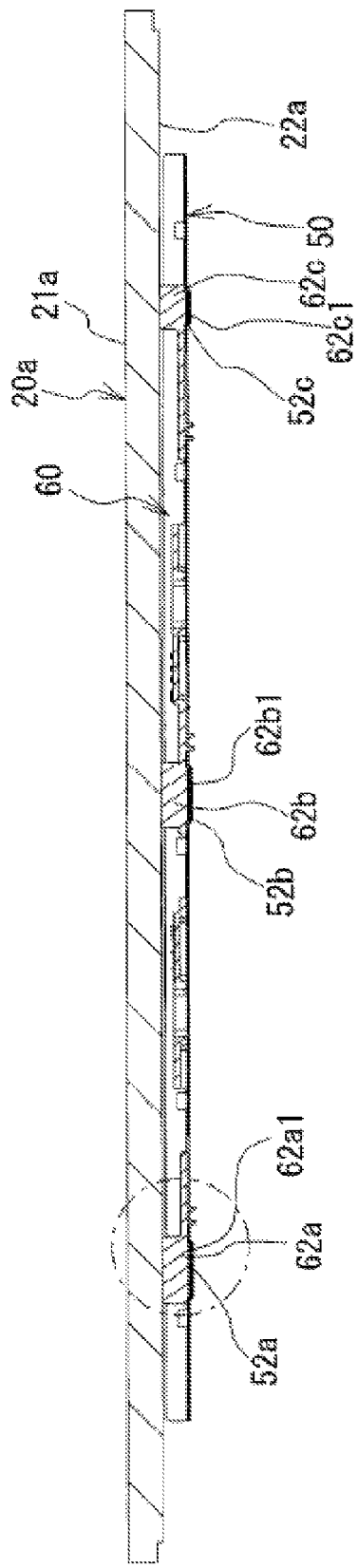
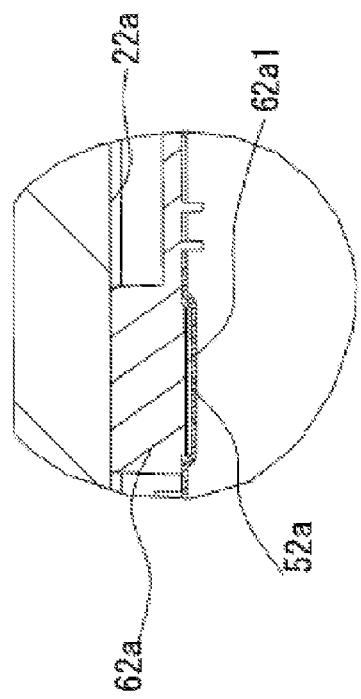
FIG. 11A
FIG. 11B

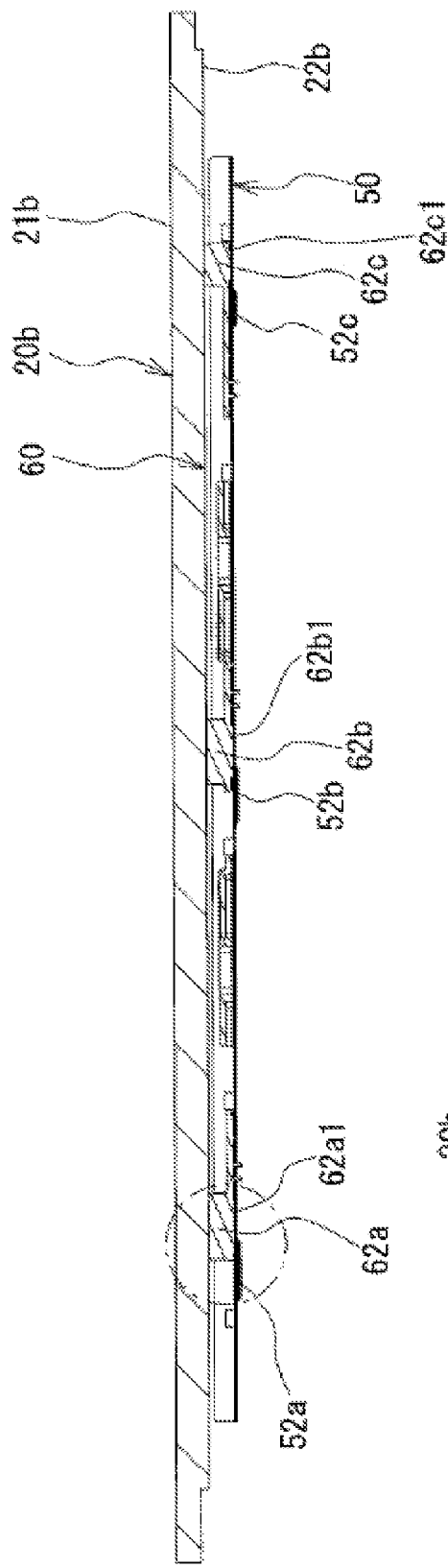
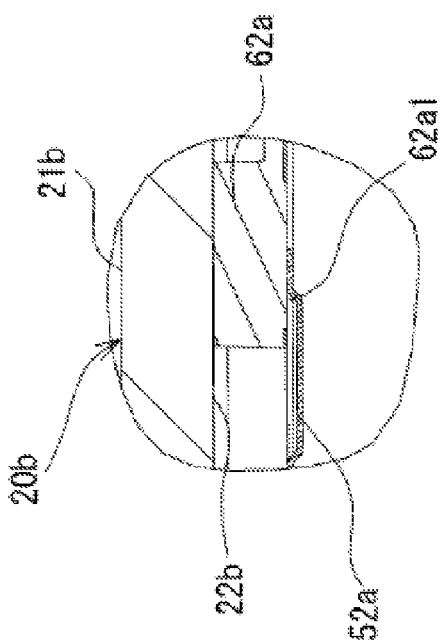
FIG. 12A
FIG. 12B

DISPLAY APPARATUS

CROSS-REFERENCE TO RELATED APPLICATION(S)

This application is based upon and claims the benefit of priority of the prior Japanese Patent Application No. 2012-66391, filed on Mar. 22, 2012, the entire contents of which are incorporated herein by reference.

FIELD

The embodiments discussed herein are related to display apparatuses.

BACKGROUND

A display apparatus includes a display unit and a frame that covers side surfaces of the display unit. Brackets are fixed to the left and right side surfaces of the display unit with screws etc. The frame is fixed to the display unit by fixing the brackets to the frame with the screws.

Related technology is disclosed in Japanese Laid-open Patent Publication Nos. 2010-191407 and 2009-237246.

SUMMARY

According to one aspect of the embodiments, a display apparatus includes: a display unit; a frame that covers a side surface of the display unit; and a pressing member including a facing portion that faces the side surface of the display unit, a pressing portion that protrudes from the facing portion and presses a rear surface of the display unit, and a fixing portion fixed to the frame.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A to 3C illustrate an exemplary plate;

FIGS. 11A and 11B illustrate an exemplary cross-sectional view of a mechanism and a display unit;

FIGS. 12A and 12B illustrate an exemplary cross-sectional view of a mechanism and the display unit;

DESCRIPTION OF EMBODIMENTS

Figure 1A:
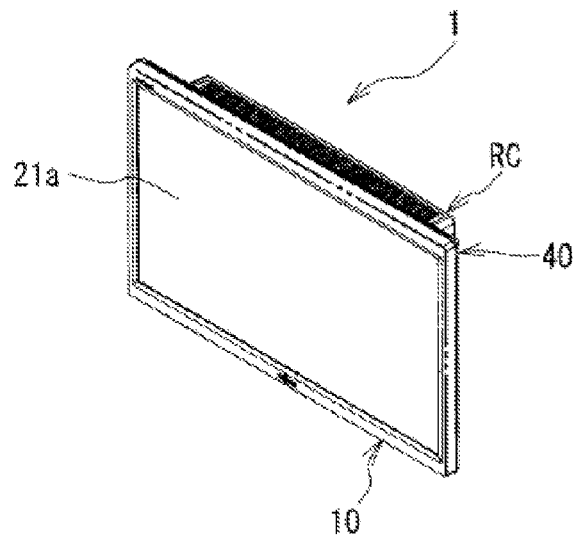
FIGS. 1A and 1B illustrate an exemplary display apparatus.
Figure 1B:
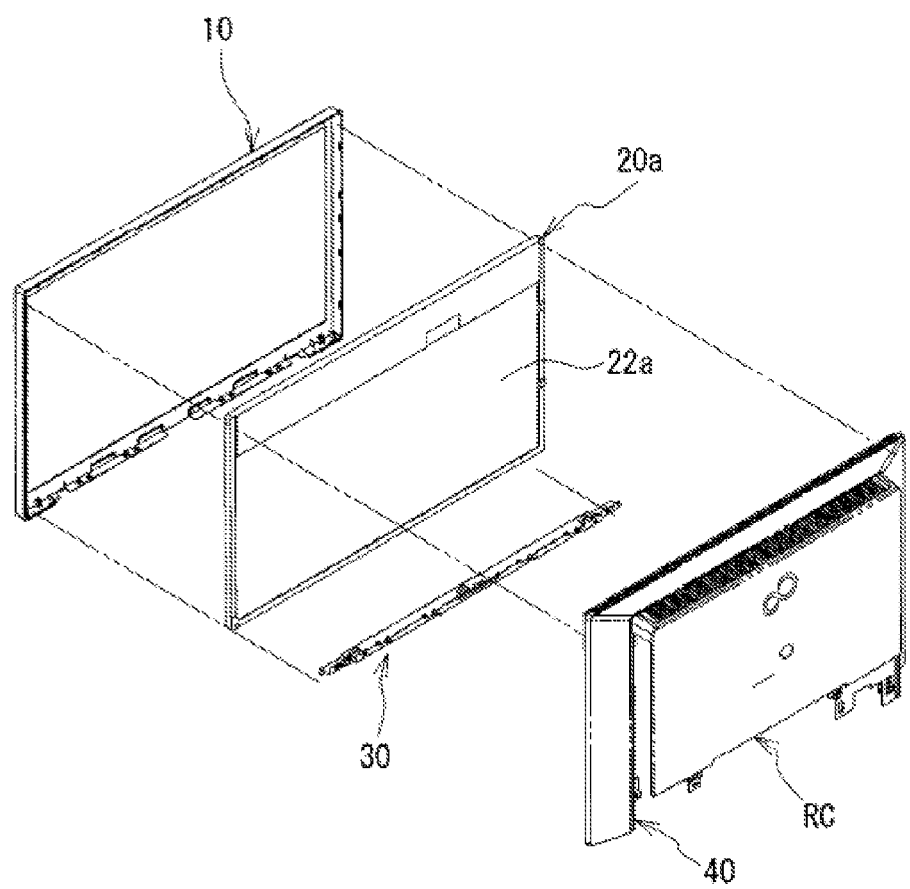

FIGS. 1A and 1B illustrate an exemplary display apparatus. A display apparatus 1 includes a frame 10, a display unit 20a, a plate 30, and a rear frame 40. The frame 10 is fixed from the front side of the display unit 20a and covers four side surfaces of the display unit 20a. The rear frame 40 is disposed on a rear surface 22a side of the display unit 20a and covers the rear surface 22a. A rear surface cover RC is mounted to the rear frame 40. The plate 30 is disposed between a lower side of a frame 10 and the lower side surface of the display unit 20a. The frame 10 and the rear frame 40 are composed of synthetic resin, and the plate 30 is composed of metal. However, they may be composed of other materials. The plate 30 may be an exemplary pressing member.

Figure 2A:
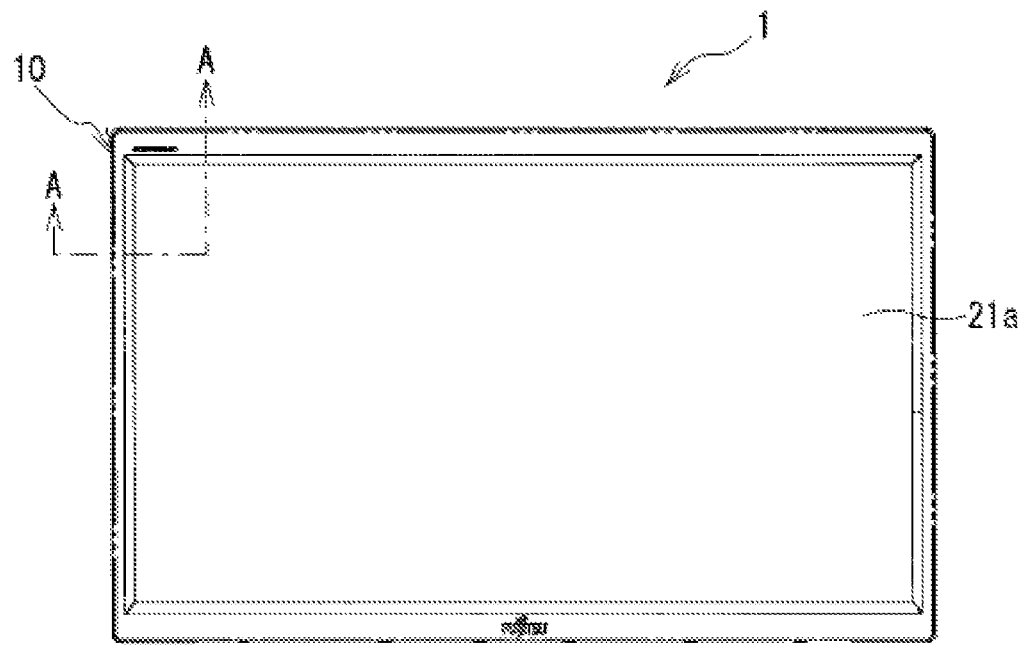
FIG. 2A illustrates an exemplary front view of a display apparatus.
Figure 2B:
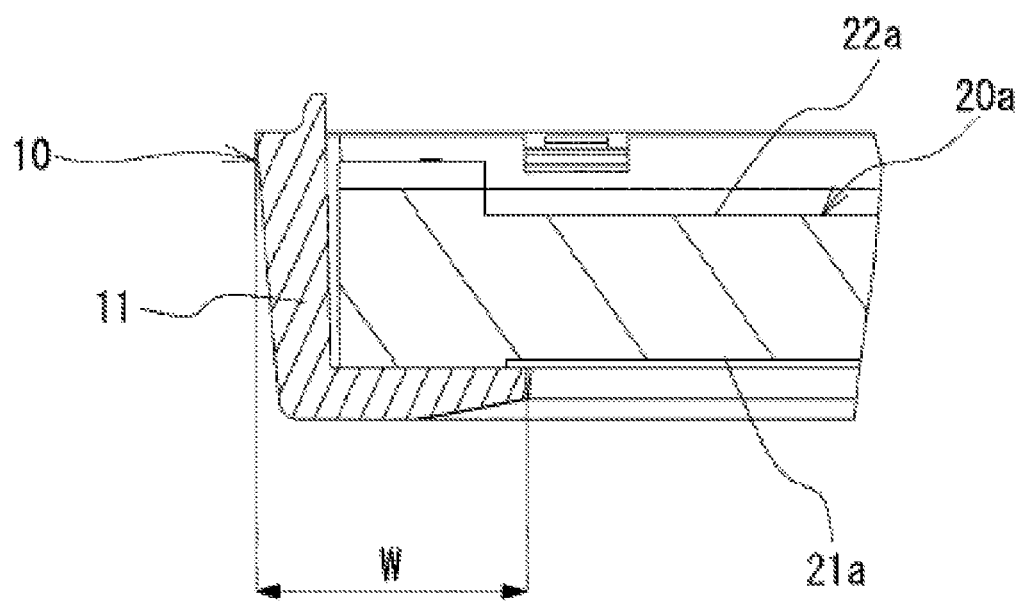
FIG. 2B illustrates an exemplary cross-sectional view of a display apparatus.

FIG. 2A illustrates an exemplary front view of a display apparatus. FIG. 2A may be a front view of the display apparatus 1 in FIG. 1A and 1B. FIG. 2B illustrates an exemplary cross-sectional view of a display apparatus. FIG. 2B may be a cross-sectional view taken along line A-A in FIG. 2A. A display screen is provided on a front surface 21a. A left side 11 of the frame 10 directly faces the left side surface of the display unit 20a. There may be no brackets etc. between the frame 10 and the left and right side surfaces of the display unit 20a. Thus, the width, W, of the left side 11 of the frame 10 may become small. A light side of the frame 10 also directly faces the right side surface of the display unit 20a, and thus, the width of the light side of the frame 10 is restricted. Only one of the left and right sides of the frame 10 may directly face the corresponding one of the left and right side surfaces of the display unit 20a.

FIGS. 3A to 3C illustrate an exemplary plate. A plate 30 is disposed between the lower side of the frame 10 and the lower side surface of the display unit 20a. The plate 30 extends along the lower side of the frame 10 and the lower side surface of the display unit 20a. The plate 30 includes a base portion 31, a bent portion 33a that is bent substantially at a right angle at one end of the base portion 31, and a bent portion 33b that is bent substantially at a right angle at the other end of the base portion 31. The base portion 31 may be an exemplary facing portion. The bent portions 33a and 33b are bent in the opposite directions. The base portion 31 has a plurality of projections 32a projecting from a first surface of the base portion 31 and a plurality of projections 32b projecting from a second surface of the base portion 31. The projections 32a and 32b are formed by bending slit portions in the base portion 31. The projections 32a and 32b may be exemplary pressing portions. The base portion 31 faces and supports the lower side surface of the display unit 20a. The bent portion 33a has a plurality of claws 35a and protrusions 36a that are engageable with the frame 10. The bent portion 33b has a plurality of claws 35b and protrusions 36b that are engageable with the frame 10. The bent portions 33a and 33b may be exemplary fixing portions.

Figure 4A:
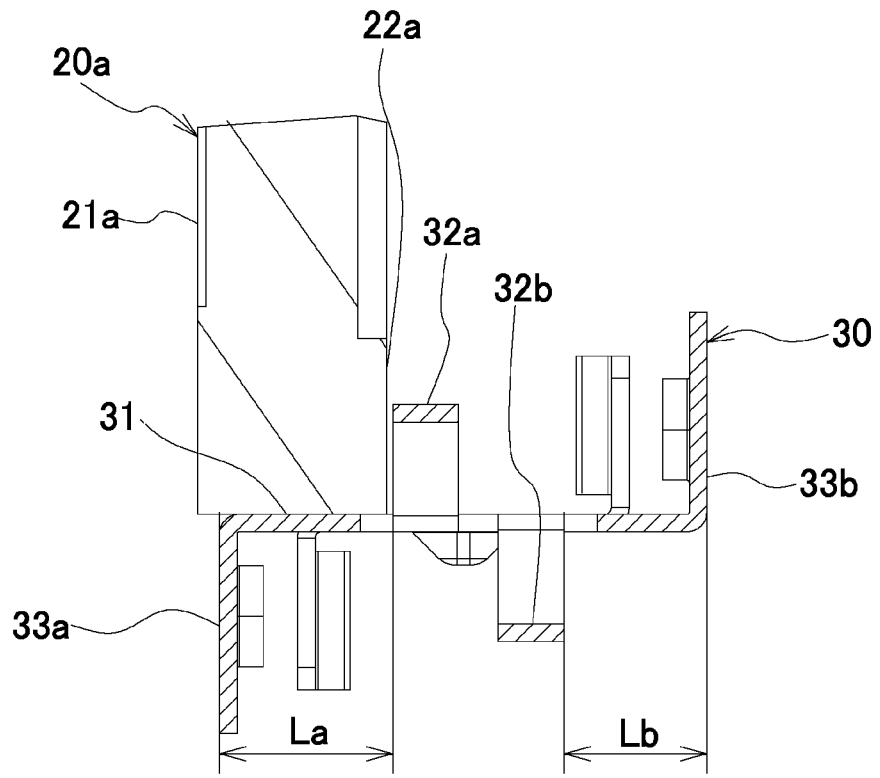
FIGS. 4A and 4B illustrate an exemplary cross-sectional view of a display unit and a plate.
Figure 4B:
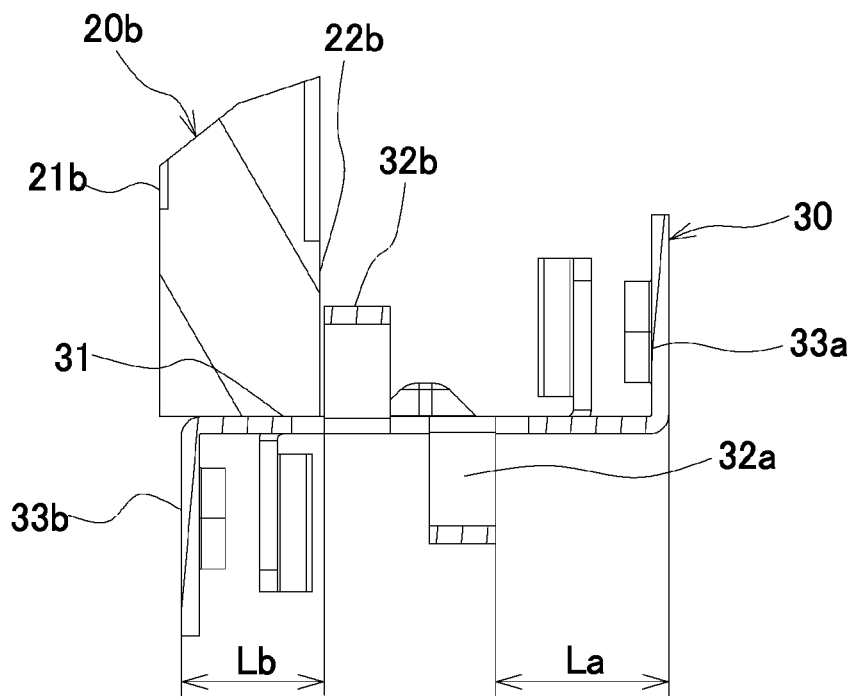

FIGS. 4A and 4B illustrate an exemplary cross-sectional view of a display unit and the plate. FIG. 4A is a cross-sectional view of the display unit 20a and the plate 30. In this state, the claws 35a and the protrusions 36a formed on the bent portion 33a engage with the frame 10, and the projections 32a formed on the base portion 31 press the rear surface 22a of the display unit 20a. Since the projections 32a presses the rear surface 22a of the display unit 20a, the position of the display unit 20a in the frame 10 in the thickness direction of the display unit 20a is stabilized. Thus, without brackets that may be fixed to the left and right side surfaces of the display unit 20a, the display unit 20a is stably held in the frame 10.

FIG. 4B is a cross-sectional view of a display unit 20b and the plate 30. The thickness of the display unit 20b is smaller than the thickness of the display unit 20a. Since the display unit 20b is supported by the second surface of the base portion 31 of the plate 30, the projections 32b support the rear surface 22b of the display unit 20b. Thus, the display unit 20b is held. The front and rear surfaces of the base portion 31 selectively face the display unit, and the projections 32a and 32b selectively press the rear surface of the display unit.

As illustrated in FIGS. 4A and 4B, the distance, La, between one end of the base portion 31 and the projection 32a and the distance, Lb, between the other end of the base portion 31 and the projection 32b, in the thickness direction of the display unit supported by the plate 30 (the transverse direction of the base portion 31), are different. For example, the distance La is larger than the distance Lb. Therefore, the plate 30 may press two types of display units having different thicknesses without using any additional parts. When the display unit 20b is supported by the second surface of the base portion 31, the claws 35b and the protrusions 36b that are formed at the bent portion 33b engage with the frame 10.

Figure 5A:
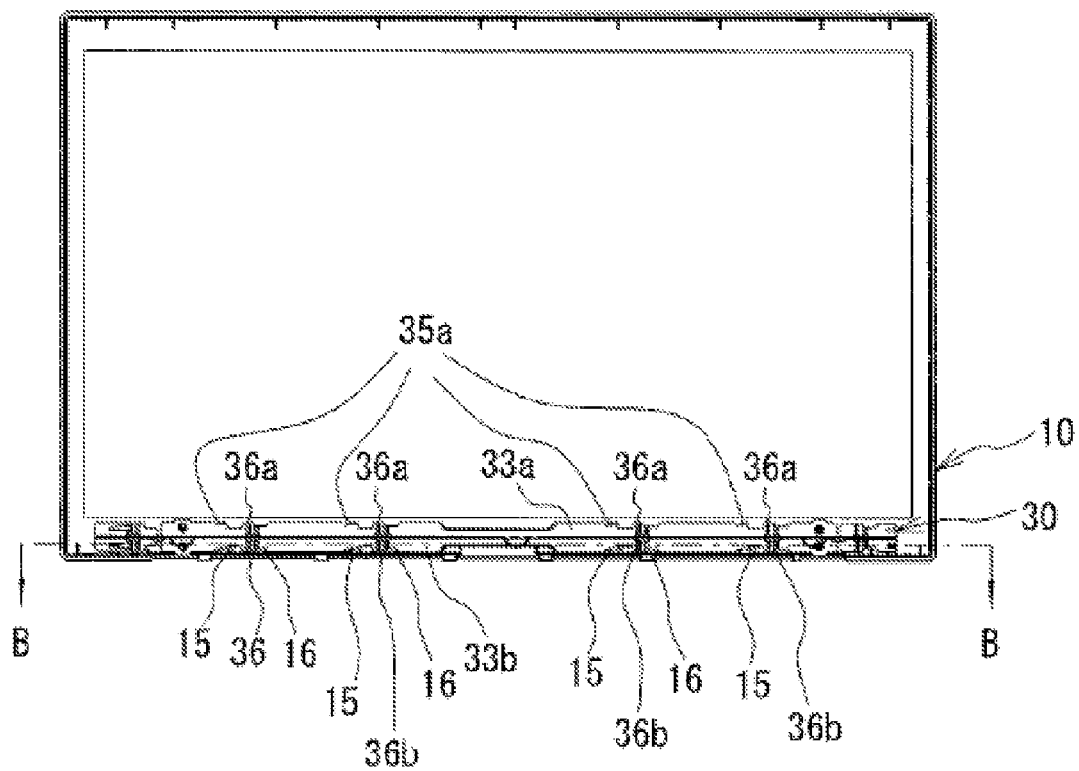
FIG. 5A illustrates an exemplary back view of a frame.
Figure 5B:
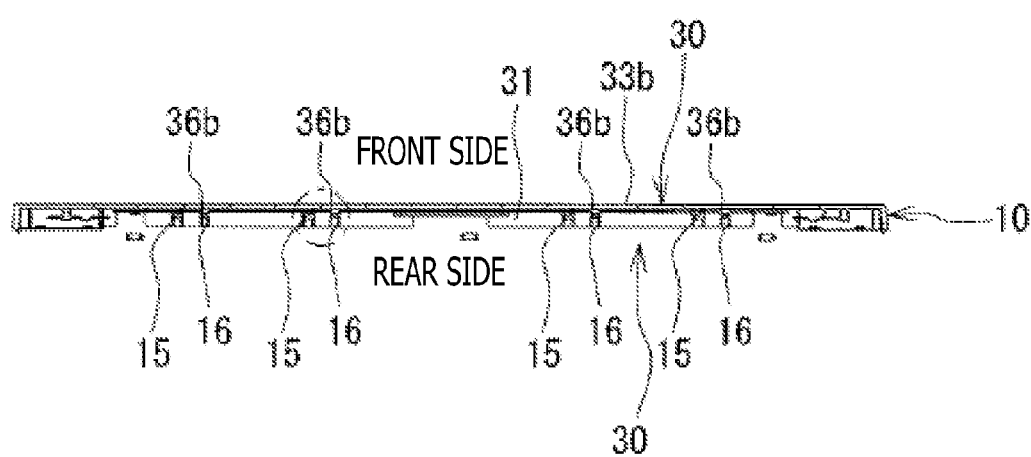
FIG. 5B illustrates an exemplary cross-sectional view of a frame.
Figure 6A:
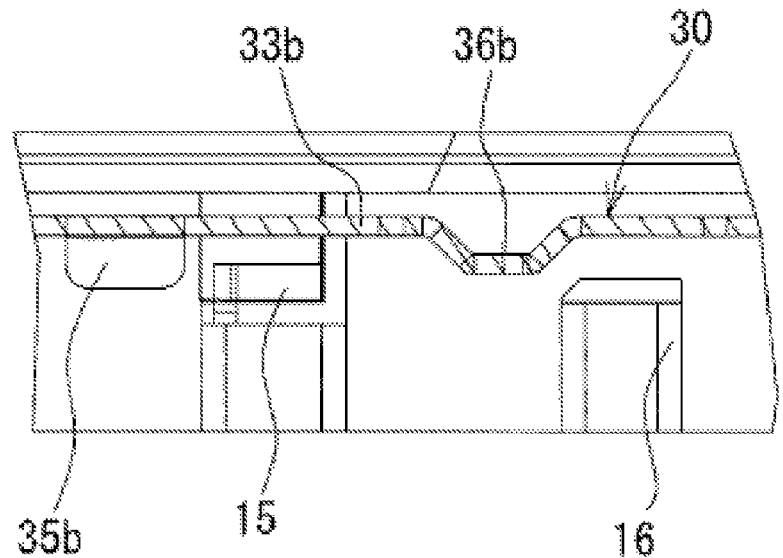
FIGS. 6A and 6B illustrate exemplary enlarged views of a plate.
Figure 6B:
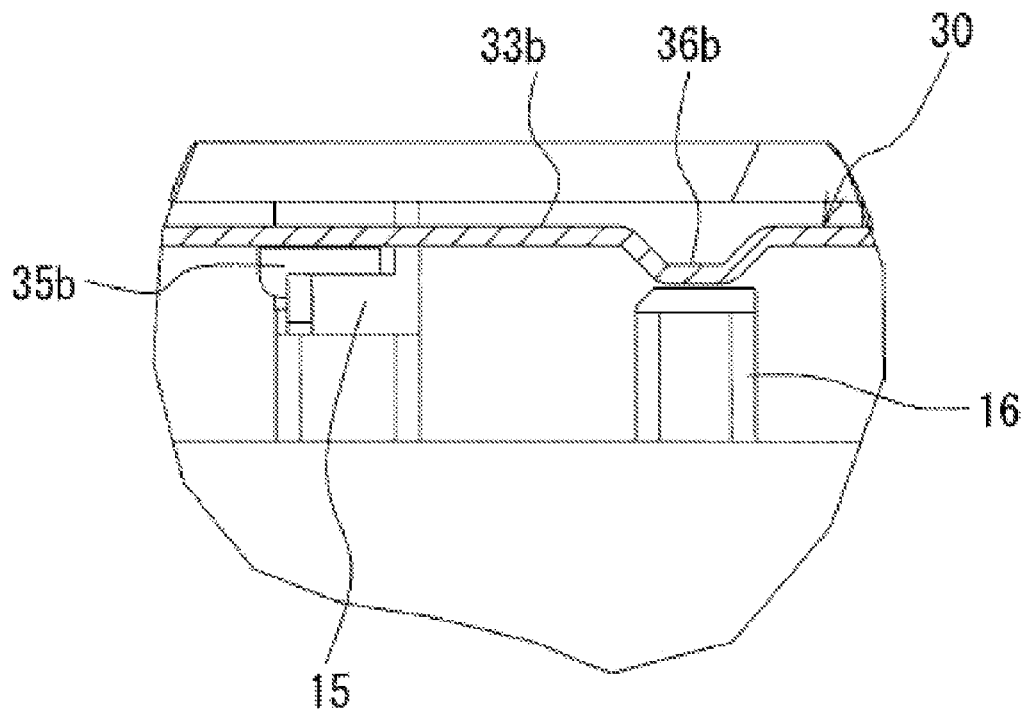

FIG. 5A illustrates an exemplary back view of a frame. FIG. 5A illustrates the back view of the frame 10 engaged with the plate 30. FIG. 5B illustrates an exemplary cross-sectional view of a frame. FIG. 5B is a cross-sectional view taken along line B-B in FIG. 5A. A plurality of pinch tabs 15 and ribs 16 are formed on the inner side of the lower side of the frame 10. The pinch tabs 15 and the ribs 16 are engageable with the claws 35b and the protrusions 36b, or the claws 35a and the protrusions 36a. FIGS. 6A and 6B illustrates an exemplary enlarged view of a plate. FIG. 6A is an enlarged view of the plate 30 before being engaged with the frame 10. FIG. 6B is an enlarged view of the plate 30 after being engaged with the frame 10. By sliding the plate 30, the claws 35b and the protrusions 36b that are not engaged with the pinch tabs 15 and the ribs 16, as illustrated in FIG. 6A, engage with the pinch tabs 15 and the ribs 16, respectively, as illustrated in FIG. 6B. The pinch tabs 15 are formed so as to stand upright from a wall portion of the lower side of the frame 10, and, by sliding the plate 30, the claws 35b of the plate 30 are inserted between the wall portion of the lower side of the frame 10 and the pinch tabs 15. The protrusions 36b abut against the ribs 16 and restrict the movement of the plate 30. Thus, the plate 30 is held by the frame 10. Because the plate 30 that is made of metal engages with the lower side of the frame 10 that is made of synthetic resin, distortion of the lower side of the frame 10 is corrected.

Figure 7A:
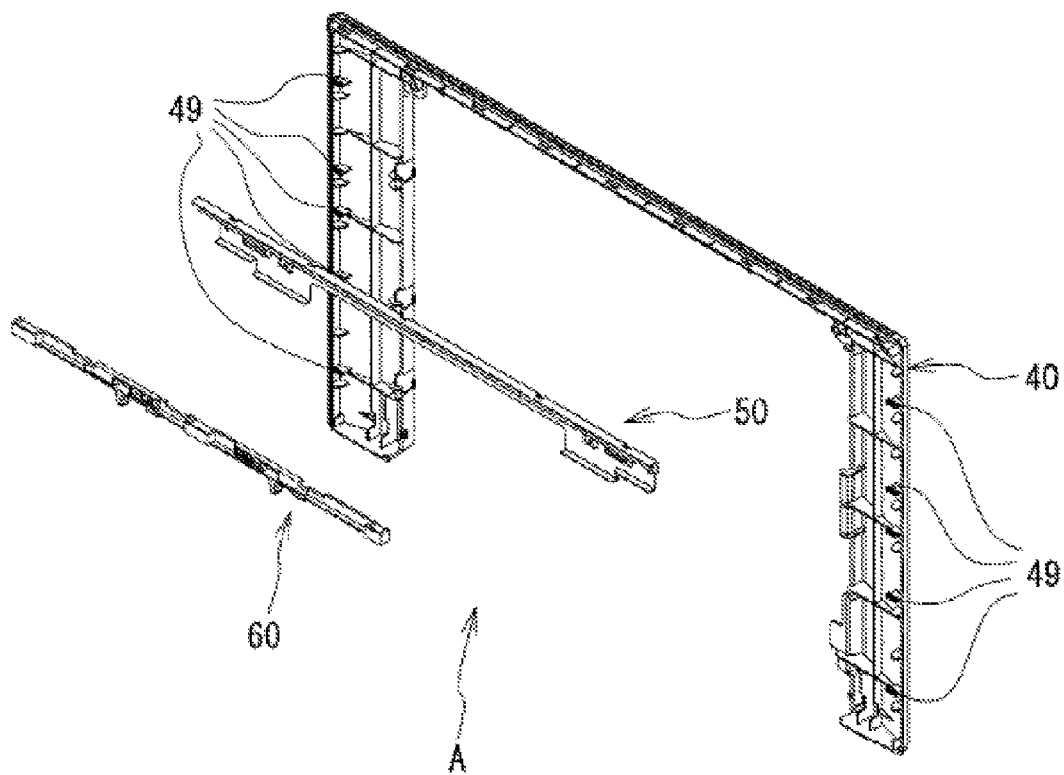
FIG. 7A illustrates an exemplary perspective view of a mechanism and a rear frame.
Figure 7B:
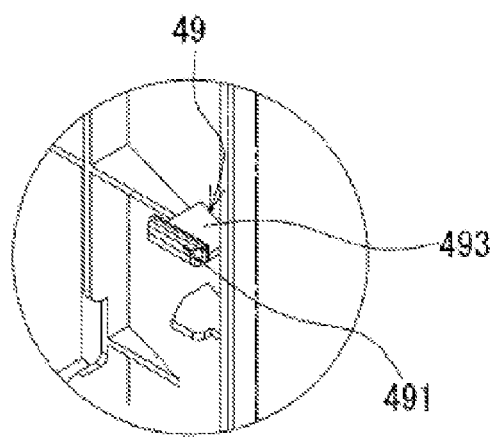
FIG. 7B illustrates an exemplary enlarged view of a claw.

FIG. 7A illustrates an exemplary perspective view of a mechanism and a rear frame. FIG. 7A is a perspective view of a mechanism A and the rear frame 40. The rear frame 40 is formed in a substantially angular U shape. The rear frame 40 covers an upper part and left and right side parts of the rear surface 22a of the display unit 20a. A plurality of claws 49 are formed along the left and right side parts of the rear frame 40. The claws 49 are engageable with notches 19 provided in the frame 10 illustrated in, for example, FIG. 3A. The notches 19 are provided in the left and right sides of the frame 10. The notches 19 may be one example of a receiving portion. The claws 49 may be one example of an engaging portion. The rear frame 40 is mounted to the frame 10 by engaging the claws 49 being engaged with the notches 19. FIG. 7B illustrates an exemplary enlarged view of a claw. The claw 49 includes a body 491 projecting from an inner surface of the rear frame 40 and a flange 493 formed at the tip of the body 491. The body 491 is elastically deformed toward left and right sides of the claw 49 when the flange 493 is to be engaged with the corresponding notch 19 in the frame 10. As illustrated in FIGS. 7A and 3A, when the rear frame 40 is to be mounted to the frame 10 that is mounted to the display unit 20a, the claws 49 are located on the rear surface 22a side of the display unit 20a. For example, the claws 49 may not be located between the frame 10 and the side surfaces of the display unit 20a. Therefore, the frame 10 becomes thin.

Figure 8A:
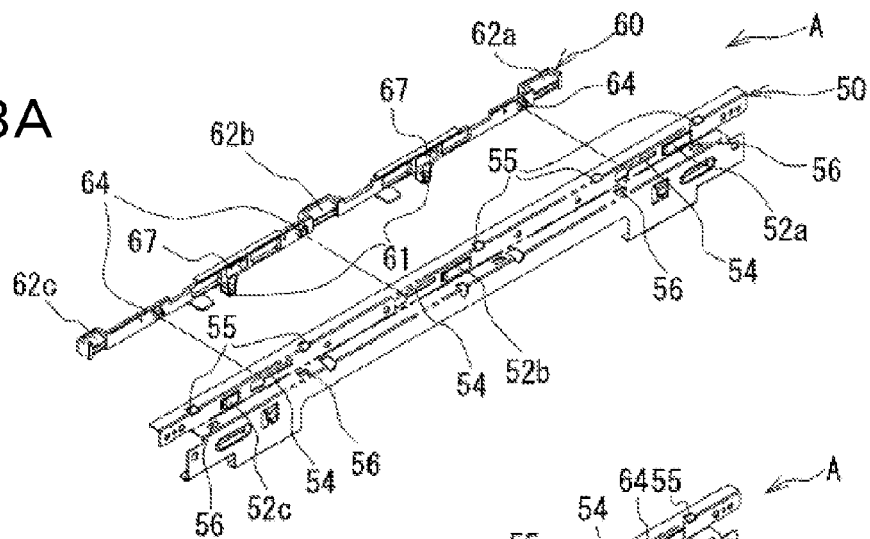
FIGS. 8A to 8C illustrate an exemplary mechanism.
Figure 8B:
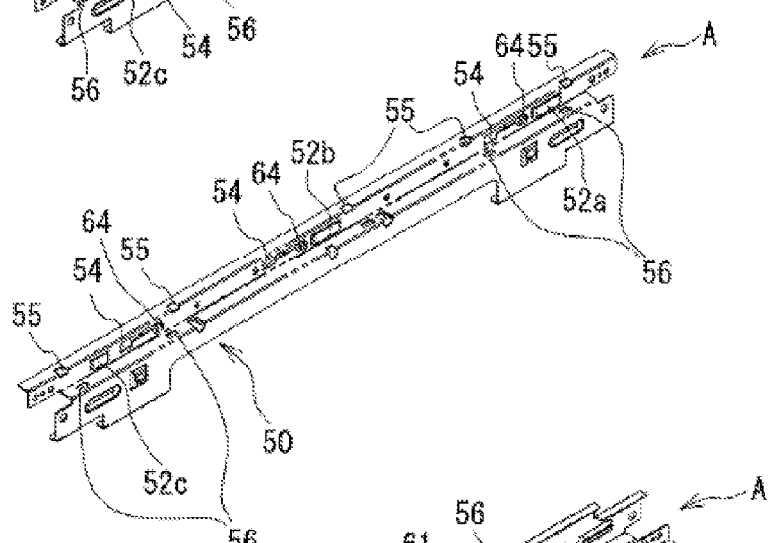
Figure 8C:
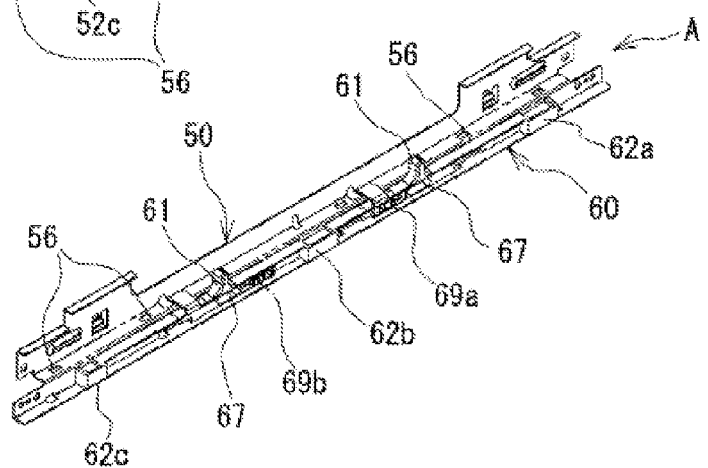

FIGS. 8A to 8C illustrate an exemplary mechanism. The mechanism A may be one example of an pressing mechanism. The mechanism A is fixed to an upper side of the rear frame 40 and presses the rear surface of the display unit 20a. The mechanism A includes a plate 50 and a spacer 60. The plate 50 may be one example of a fixing member. The spacer 60 may be one example of a slide member. The plate 50 may be made of metal, and the spacer 60 may be made of synthetic resin. The plate 50 includes recesses 52a to 52c and a plurality of holes 54, a plurality of holes 55, and a plurality of holes 56. The recesses 52a to 52c are provided along the longitudinal direction of the plate 50. The holes 54, 55, and 56 are also provided along the longitudinal direction of the plate 50. Although the recesses 52a to 52c are protruding in FIG. 8A, when viewed from the other side, the recesses 52a to 52c are depressed. The holes 54 are elongated in the longitudinal direction of the plate 50.

The spacer 60 includes projections 62a to 62c, a plurality of tabs 61, a plurality of claws 64, and a plurality of openings 67. The openings 67 may be one example of an opening. The projections 62a to 62c are formed along the longitudinal direction of the spacer 60. The tabs 61, the claws 64, and the openings 67 are also provided along the longitudinal direction of the spacer 60. The tabs 61 protrude downward. The projections 62a to 62c protrude toward the rear surface 22a of the display unit 20a. FIGS. 8B and 8C illustrate the plate 50 and the spacer 60 that are assembled together. In a state illustrated in FIGS. 8B and 8C, the recesses 52a to 52c are provided at positions corresponding to the projections 62a to 62c.

Figure 9A:
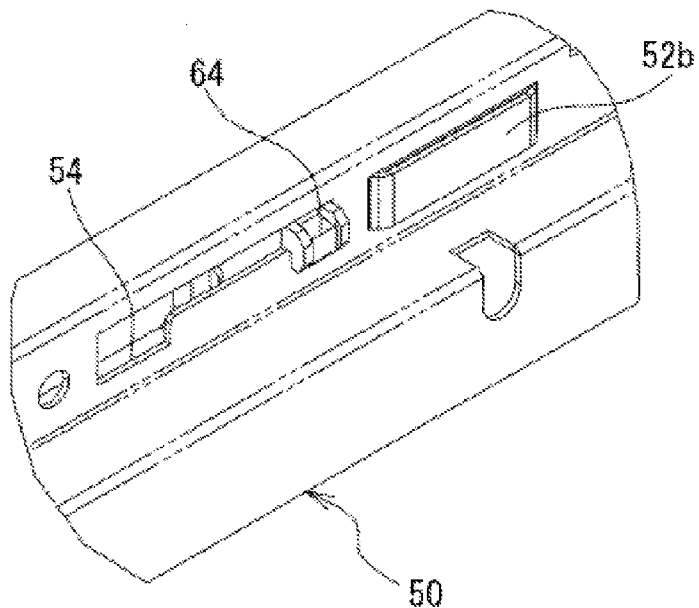
FIGS. 9A to 9C illustrate an exemplary engagement between holes in a plate and claws on a spacer.
Figure 9B:
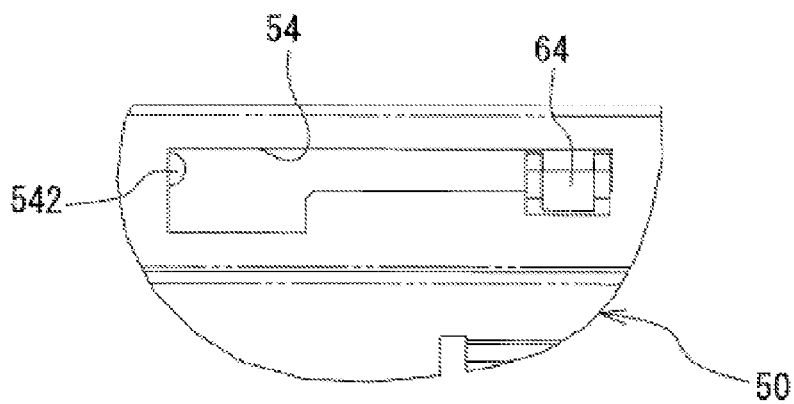
Figure 9C:
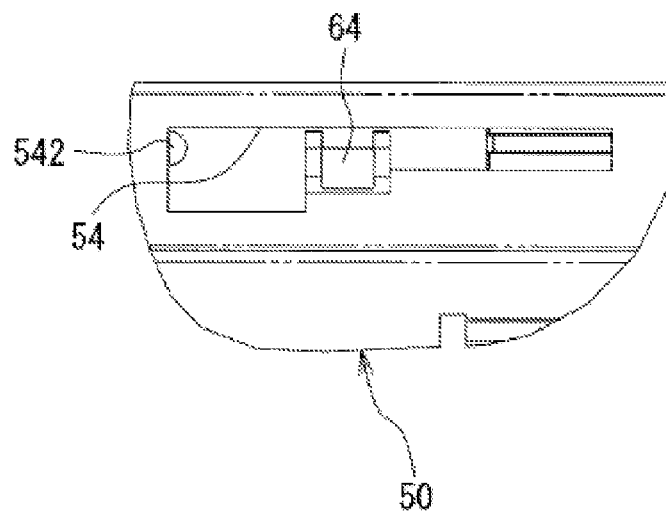

FIGS. 9A to 9C illustrate an exemplary engagement between a hole in a plate 50 and a claw on the spacer 60. The claws 64 engage with the holes 54 in such a manner as to be capable of sliding in the longitudinal direction. Hence, the spacer 60 engages with the plate 50 in such a manner as to be capable of sliding within a predetermined range, in the longitudinal direction of the plate 50. The distance between the plate 50 and the spacer 60 changes as the spacer 60 slides relative to the plate 50. As illustrated in FIGS. 9B and 9C, each hole 54 has, on an inner periphery at one end thereof, a stopper that inhibits the claw 64 from being disengaged from the hole 54.

Figure 10A:
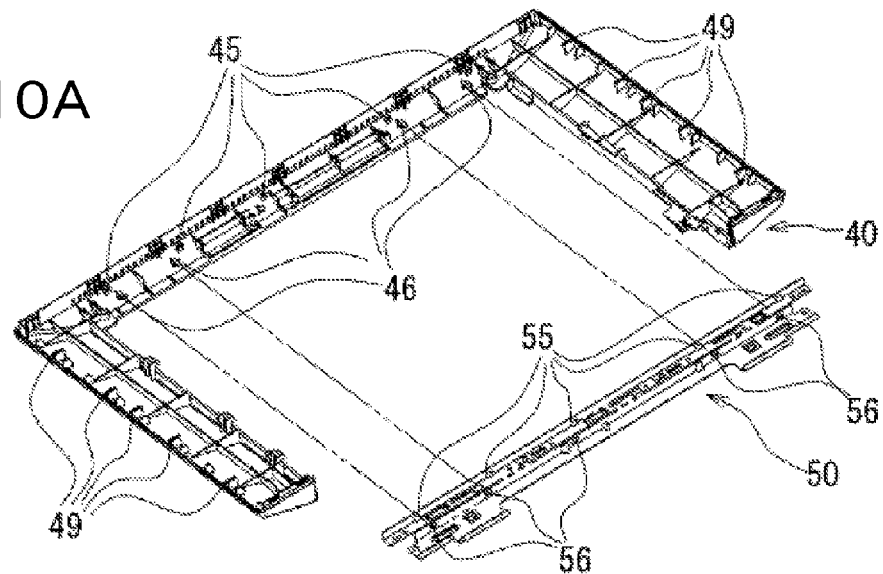
FIGS. 10A to 10C illustrate an exemplary engagement between a mechanism and a rear frame.
Figure 10B:
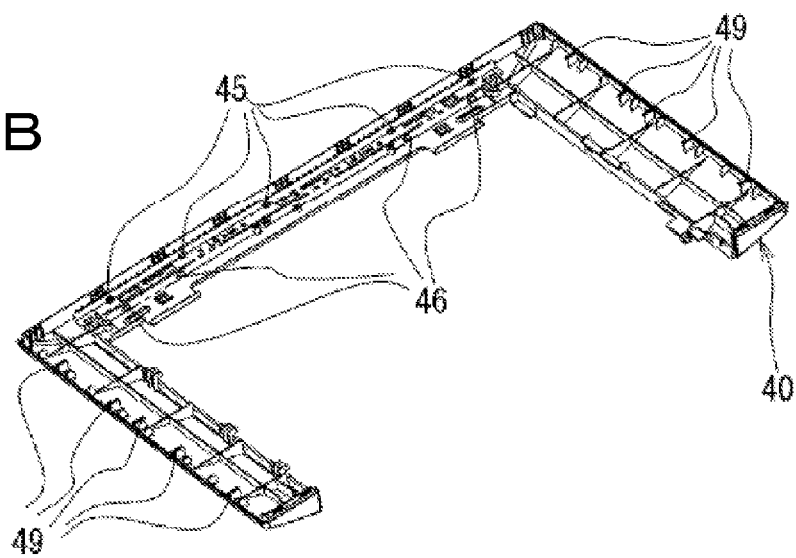
Figure 10C:
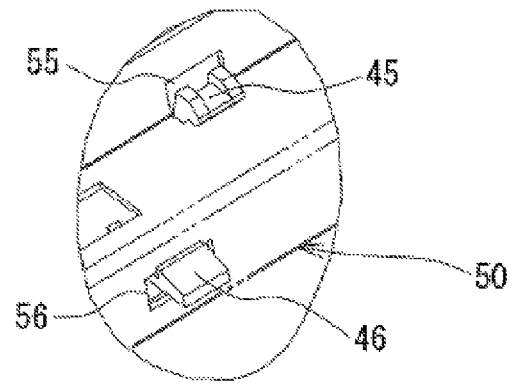

FIGS. 10A to 10C illustrate an exemplary engagement between a mechanism and a rear frame. FIG. 10C is an enlarged view of FIG. 10B. The rear frame 40 has a plurality of claws 45 and a plurality of claws 46 formed on the inner side of the upper side thereof. The claws 45 and 46 extend perpendicular to each other. The claws 45 protrude in the thickness direction of the display apparatus 1, and the claws 46 protrude along the plane of the display apparatus 1. The plate 50 is held by the rear frame 40 by engaging the claws 45 and 46 with the holes 55 and 56, respectively, in the plate 50. The mechanism A is held by the rear frame 40 by engaging the spacer 60 with the plate 50 that is held by the rear frame 40. By engaging the plate 50 that is made of metal with the rear frame 40 that is made of synthetic resin, the distortion of the rear frame 40 is corrected.

FIGS. 11A and 11B illustrate an exemplary cross-sectional view of a mechanism and a display unit. The projections 62a to 62c of the spacer 60 press the rear surface 22a of the display unit 20a. Thus, the position of the display unit 20a may be stabilized. The projections 62a to 62c may be one example of a pressing portion.

FIG. 11B is an enlarged view of FIG. 11A. The projections 62a to 62c include protruding portions 62a1 to 62c1 that protrude toward the plate 50. The protruding portion 62a1 is formed on the projection 62a, on the side opposite to the side that abuts against the rear surface 22a of the display unit 20a. The protruding portions 62a1 to 62c1 are slightly protruding toward the plate 50. The protruding portions 62a1 to 62c1 may protrude by substantially the same extent. The protruding portions 62a1 to 62c1 are accommodated in the recesses 52a to 52c, respectively. The recesses 52a to 52c may have substantially the same depth.

FIGS. 12A and 12B illustrate an exemplary cross-sectional view of a mechanism and a display unit. FIG. 12B is an enlarged view of FIG. 12A. As illustrated in FIG. 12B, the protruding portions 62a1 to 62c1 are disengaged from the recesses 52a to 52c by sliding the spacer 60 relative to the plate 50. Thus, the protruding portions 62a1 to 62c1 slide onto portions other than the recesses 52a to 52c, and the distance between the plate 50 and the spacer 60 increases by the extent by which the protruding portions 62a1 to 62c1 protrude. For example, the thickness of the mechanism A in the thickness direction of the display unit 20a changes as the spacer 60 slides relative to the plate 50. The thickness of the mechanism A illustrated in FIG. 12A may be larger than the thickness of the mechanism A illustrated in FIG. 11A. Therefore, it may be possible to press the display unit 20b that is thinner than the display unit 20a.

Figure 13A:
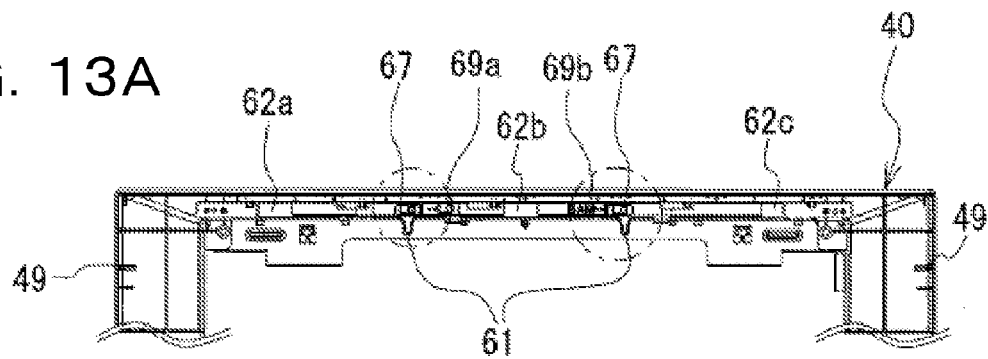
FIGS. 13A to 13C illustrate an exemplary rear frame and mechanism.
Figure 13B:
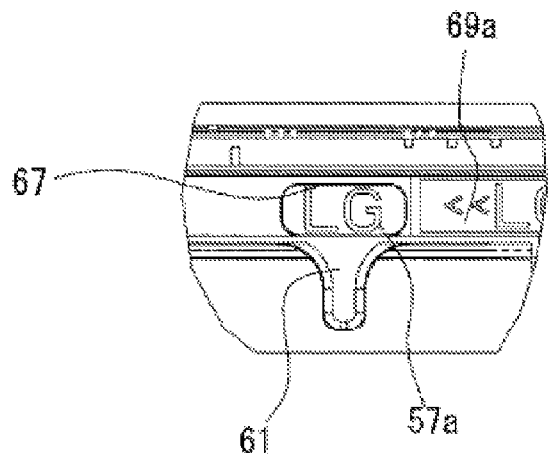
Figure 13C:
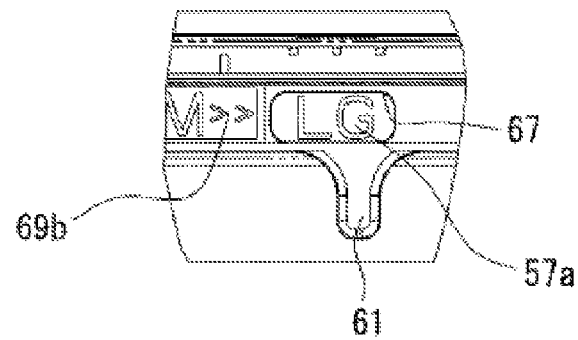
Figure 14A:
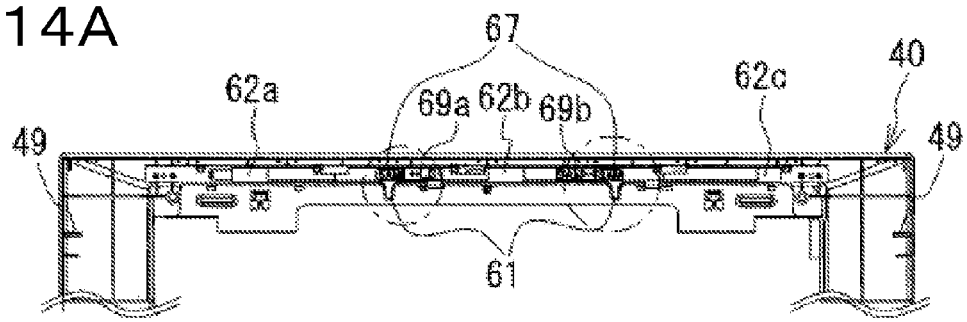
FIGS. 14A to 14C illustrate an exemplary rear frame and mechanism.
Figure 14B:
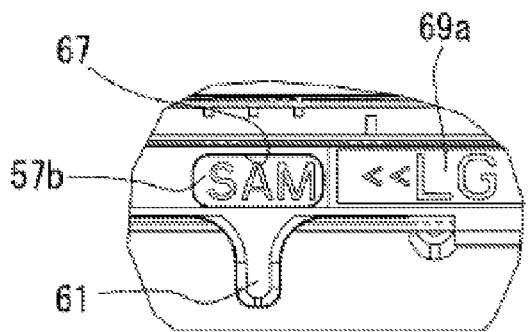
Figure 14C:
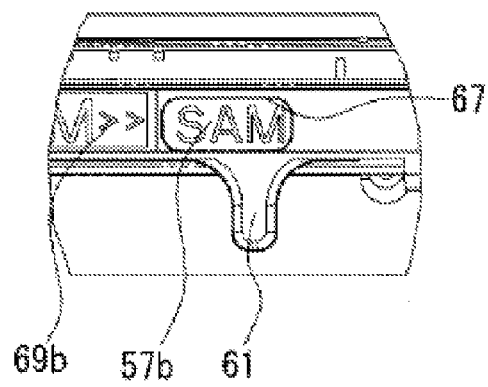

FIGS. 13A to 13C illustrate an exemplary rear frame and mechanism. FIG. 13A illustrates the rear frame 40 and the mechanism A, in a state corresponding to FIG. 11A. In FIG. 13A, the protruding portions 62a1 to 62c1 of the projections 62a to 62c are accommodated in the recesses 52a to 52c, respectively. FIGS. 13B and 13C are enlarged views of FIG. 13A. FIGS. 14A to 14C illustrate an exemplary rear frame and mechanism. FIG. 14A illustrates the mechanism A that engages with the rear frame 40, in a state corresponding to FIG. 12A. FIGS. 14B and 14C are enlarged views of FIG. 14A.

As illustrated in FIGS. 13B and 13C, indicators 57a formed on the plate 50 are exposed from the openings 67 provided in the spacer 60. The type of the display which is applicable in a state where the distance between the plate 50 and the spacer 60 is small is indicated on the indicators 57a. For example, the type of the display unit 20a is indicated on the indicators 57a. As illustrated in FIGS. 14B and 14C, indicators 57b formed on the plate 50 are exposed from the openings 67. The type of the display unit which is applicable in a state where the distance between the plate 50 and the spacer 60 is large is indicated on the indicators 57b. For example, the type of the display unit 20b is indicated on the indicators 57b. When the spacer 60 slides relative to the plate 50, the indicators 57a or the indicators 57b are exposed from the openings 67, and the others are covered. Therefore, an operator may easily change the distance between the plate 50 and the spacer 60 according to the type of the display unit. The spacer 60 may be easily slid relative to the plate 50 by holding the tabs 61. The type of the compatible display unit and the slide direction are indicated on indicating portions 69a and 69b.

The plate 30 supports the lower side surface of the display unit 20a. For example, the plate 30 may be disposed between the frame 10 and one of the left, right, and upper side surfaces of the display unit 20a. It is possible to use the plate 30 alone, without the mechanism A. It is possible to use the mechanism A alone, without the plate 30. The mechanism A presses the rear surface of the display unit, at a portion near the upper side surface. For example, the mechanism A may be fixed to the rear frame 40 so as to press the rear surface of the display unit, at a portion near one of the left and right side surfaces, or the rear frame 40 may be fixed so as to press the rear surface of the display unit, at a portion near the lower side surface.

Figure 15A:
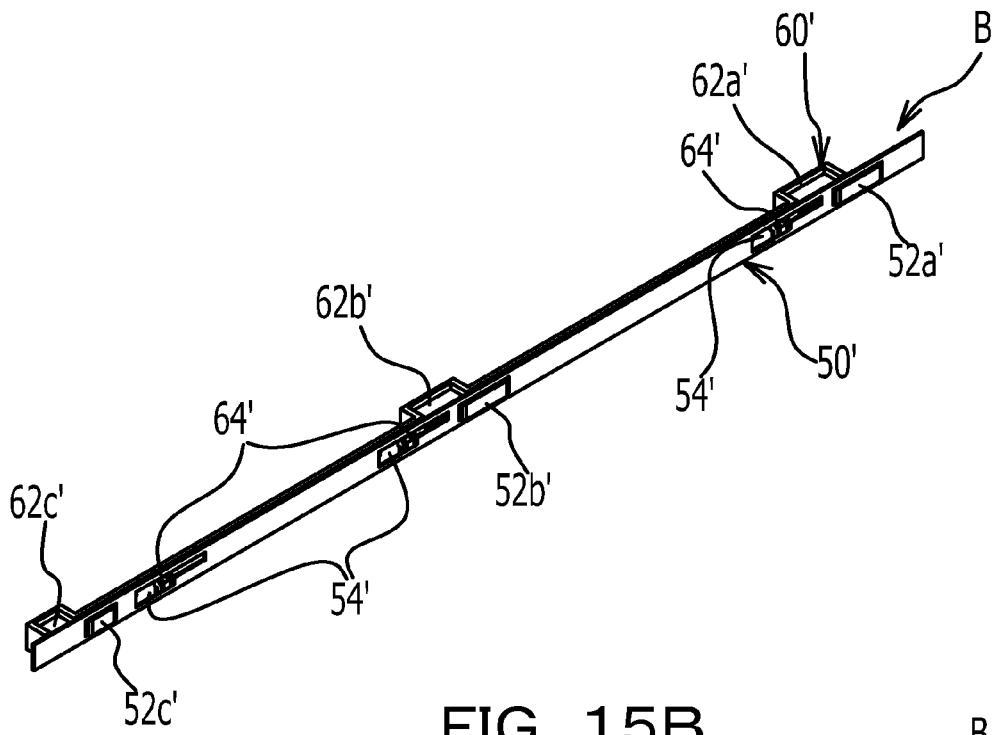
FIGS. 15A and 15B illustrate an exemplary mechanism.
Figure 15B:
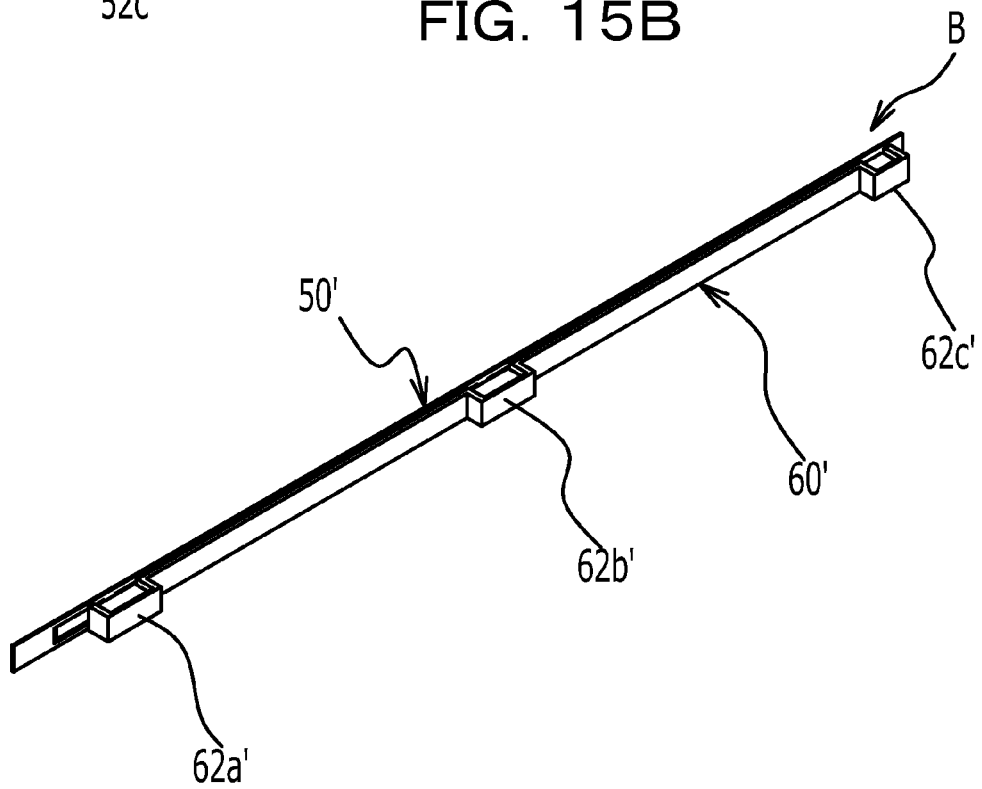
Figure 16A:
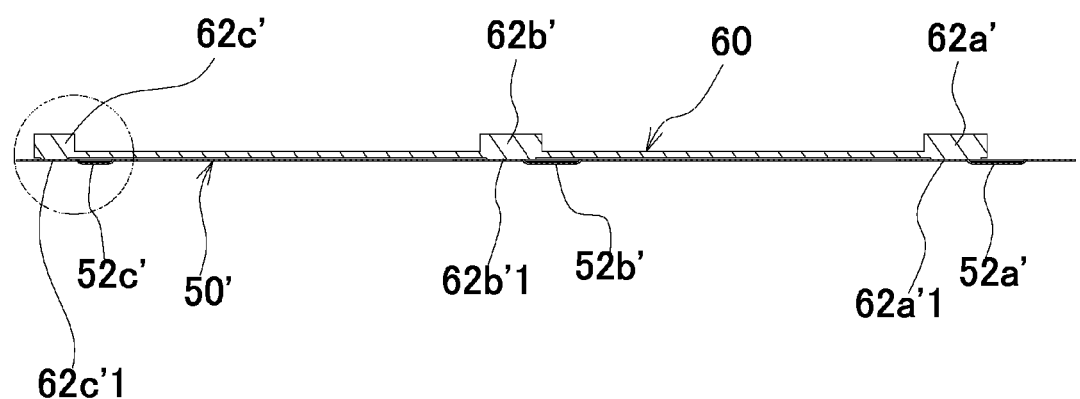
FIGS. 16A and 16B illustrate an exemplary cross-sectional view of a mechanism.
Figure 16B:
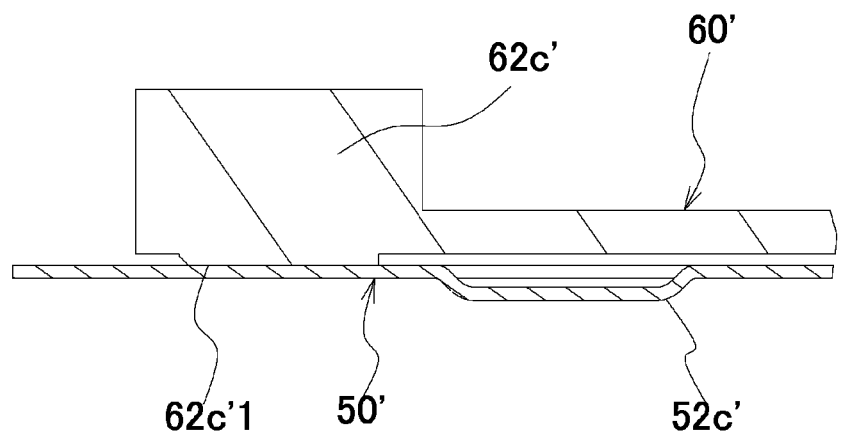

Parts of a mechanism B that are similar to those of the mechanism A will be denoted by similar reference numerals. FIGS. 15A and 15B illustrate an exemplary mechanism. The mechanism B may be one example of a pressing mechanism. FIGS. 16A and 16B illustrate an exemplary cross-sectional view of a mechanism. FIG. 16A may be a cross-sectional view of the mechanism B, and FIG. 16B is an enlarged view of FIG. 16A. A spacer 60' engages with a plate 50' in such a manner as to be capable of sliding within a predetermined range. As the spacer 60' slides, protruding portions 62a'1 to 62c'1 of projections 62a' to 62c' are housed in or removed from recesses 52a' to 52c'. Thus, the distance between the plate 50' and the spacer 60' changes, whereby the mechanism B may cope with display units having different thicknesses. The mechanism B may be fixed to any side of the rear frame 40.

In the mechanism A, the recesses 52a to 52c have substantially the same depth. For example, the plate 50 may be provided with a plurality of recesses having different depths. Since the protruding portions 62a1 is housed in any of the recesses having different depths, the distance between the plate 50 and the spacer 60 changes to several different levels.

In the mechanism A, the recesses 52a etc., are provided in the plate 50, and the protruding portions 62a1 etc. are provided on the spacer 60. For example, the recesses may be provided in the spacer 60, and the protruding portions may be provided on the plate 50.

In the mechanism A, the protruding portion 62a1 is provided on the opposite side of the projection 62a that presses the rear surface of the display unit. For example, the protruding portion 62a1 may be provided at a portion away from the projection 62a.

The display apparatus may be, for example, a monitor for a desktop computer, a monitor having a built-in computer, a television, an audio system, or any other electric appliance. The display apparatus may be a portable apparatus; for example, a tablet computer, a mobile phone, a portable television, an electronic dictionary, a personal digital assistant (PDA), a game machine, a camera, a music player, or a navigation device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A display apparatus comprising: a display unit; a frame that covers a side surface of the display unit; and a pressing member including a facing portion that includes a first surface, which faces the side surface of the display unit in a first direction, and a second surface, which faces in a second direction opposite to the first direction, wherein a first fixing portion and a second fixing portion are provided at both ends of the pressing member respectively, the first fixing portion extends in the second direction from the second surface and the second fixing portion extends in the first direction from the first direction; wherein the first fixing portion is provided nearer the display unit than the second fixing portion and underlies a bottom surface of the display unit; and a pressing portion including a first pressing portion and a second pressing portion is provided between the first fixing portion and the second fixing portion and away from the first fixing portion and the second fixing portion, the first pressing portion protrudes from the first surface in the first direction, and the second pressing portion protrudes from the second surface in the second direction.

2. The display apparatus according to claim 1, wherein the distance between one of the both ends of the pressing member and the first pressing portion and the distance between the other of the both ends of the pressing member and the second pressing portion are different.

3. The display apparatus according to claim 1, wherein at least one of a left side surface and a right side surface of the display unit directly faces the frame.

4. The display apparatus according to claim 1, further comprising:
   a rear surface member disposed on a rear side of the display unit; and
   a pressing mechanism that is fixed to the rear surface member and presses the rear surface of the display unit.

5. The display apparatus according to claim 1, further comprising a rear surface member disposed on a rear side of the display unit,
   wherein the frame includes a receiving portion, and
   wherein the rear surface member includes an engaging portion that is located on the rear side of the display unit and engages with the receiving portion.

6. The display apparatus according to claim 5, wherein the engaging portion is not located between the frame and the side surface of the display unit.

7. A display apparatus comprising:
   a display unit;
   a frame that covers a side surface of the display unit;
   a rear surface member disposed on a rear side of the display unit; and
   a pressing mechanism that is fixed to the rear surface member and presses a rear surface of the display unit,
   wherein the pressing mechanism includes:
   a fixing member that is fixed to the rear surface member and includes a first surface and a second surface, a first side of the first surface being directly coupled to a second side of the second surface with an angle more than zero so as to form a placing space between the first surface and the second surface; and
   a slide member, provided on the placing space and being contact with the first surface and the second surface, that presses the rear surface of the display unit and is coupled in such a manner as to be capable of sliding relative to the fixing member,
   wherein the distance between the slide member and the fixing member changing as the slide member slides relative to the fixing member.

8. The display apparatus according to claim 7,
   wherein one of the fixing member and the slide member includes a recess, and
   wherein the other of the fixing member and the slide member includes a protruding portion that is housed in or removed from the recess in accordance with the sliding.

9. The display apparatus according to claim 8,
   wherein the distance between the fixing member and the slide member changes by housing the protruding portion in the recess or removing from the recess.

10. The display apparatus according to claim 7, wherein the fixing member includes an indicator, and wherein the slide member has an opening that covers or exposes the indicator based on the sliding.

11. The display apparatus according to claim 7,
    wherein the frame includes a receiving portion, and
    wherein the rear surface member includes an engaging portion that engages with the receiving portion and is located on the rear side of the display unit.

12. The display apparatus according to claim 11, wherein the engaging portion is not located between the frame and the side surface of the display unit.

* * * * *